United States Patent
Adan (10) Patent No.: US 7,002,382 B2
(45) Date of Patent: Feb. 21, 2006

(54) PHASE LOCKED LOOP CIRCUIT (75) Inventor: Alberto O. Adan, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 8 days.

(21) Appl. No.: 10/895,080

(22) Filed: Jul. 21, 2004

(65) Prior Publication Data

US 2005/0017773 A1    Jan. 27, 2005

(30) Foreign Application Priority Data

Jul. 22, 2003   (JP)   .......................... 2003-2777931

(51) Int. Cl.
*H03L 7/06*   (2006.01)
(52) U.S. Cl. ...................................... 327/148; 327/157
(58) Field of Classification Search ................ 327/148, 327/149, 150, 156, 157, 158, 159; 321/17, 321/25; 375/375, 376
See application file for complete search history.

(56) References Cited

U.S. PATENT DOCUMENTS 6,300,838 B1 * 10/2001 Kelkar ........................ 331/17

FOREIGN PATENT DOCUMENTS

| JP | 06-085664 | 3/1994 |
|----|-----------|--------|
| JP | 08-307258 | 11/1996 |
| JP | 2000-349626 | 12/2000 |

OTHER PUBLICATIONS

Lo et al; "A 1.8V/3.5mA 1.1GHz/300MHz CMOS Dual PLL Frequency Synthesizer IC for RF Communications"; IEEE 1988, Custom Integrated Circuits Conference, pp. 571-574.

* cited by examiner

*Primary Examiner*—Linh My Nguyen
(74) *Attorney, Agent, or Firm*—Nixon & Vanderhye, P.C.

(57)   ABSTRACT

A phase locked loop circuit includes a phase comparator and a charge-pump circuit. The phase comparator and the charge-pump circuit are configured to satisfy the relationship of $K_{p2} > K_{p1}$ in an $I_o - \Delta\phi$ characteristic, where $K_{p1}$ indicates a slope $K_p$ in the case where $|\Delta\phi| > \Delta\phi_o$, $K_{p2}$ indicates a slope $K_p$ in the case where $|\Delta\phi| \leq \Delta\phi_o$, $K_p$ being defined by $K_p = dI_o/d\Delta\phi$, and $\Delta\phi_o$ being a constant indicating a predetermined phase error.

6 Claims, 5 Drawing Sheets

PHASE LOCKED LOOP CIRCUIT

This Nonprovisional application claims priority under 35 U.S.C. §119(a) on Patent Application No. 2003-277931 in Japan on Jul. 22, 2003, the entire contents of which are hereby incorporated by reference.

BACKGROUND OF THE INVENTION

1. Field of the Invention

The present invention relates to a phase locked loop circuit. Particularly, the present invention relates to a phase locked loop circuit which is preferably used for a frequency synthesizer in a communication device.

2. Description of the Related Art

Conventionally, a phase locked loop(PLL) circuit is known as a circuit for synchronizing two clock signals.

Reference 1 describes that a typical phase locked loop circuit is preferably used for a communication device.

Reference 2 describes a phase locked loop circuit which implements a non-linear $I_o$-$\Delta\phi$ characteristic.

Reference 3 describes a phase locked loop circuit which implements a linear $I_o$-$\Delta\phi$ characteristic.

Reference 4 describes a phase locked loop circuit operable to control the pulse width of the UP signal and the pulse width of the DN signal.

Reference 1: S. Lo et al.,"A 1.8V/3.5 mA 1.1 GHz/300 MHz CMOS Dual PLL Frequency Synthesizer IC for RF Communications", Proc. IEEE 1998 Custom Integrated Circuits Conference Reference 2: Japanese laid-open patent publication No. 8-307258

Reference 3: Japanese laid-open patent publication No. 6-85664

Reference 4: Japanese laid-open patent publication No. 2000-349626

However, in any of the references mentioned above, reducing a phase noise in a locked state is not considered.

One of the purposes of the present invention is to provide a phase locked loop circuit which is capable of reducing a phase noise in a locked state.

SUMMARY OF THE INVENTION

According to one aspect of this invention, there is provided a phase locked loop circuit comprising: a phase comparator for receiving a reference clock signal REF and a clock signal CLK and for comparing a phase of the reference clock signal REF with a phase of the clock signal CLK so as to output a phase difference signal which depends on a phase difference $\Delta\phi$ between the reference clock signal REF and the clock signal CLK; a charge-pump circuit for producing an output current $I_o$ which depends on the phase difference signal; a loop filter for converting the output current $I_o$ into an output voltage; a voltage controlled oscillator for generating a signal having a frequency $f_o$ which depends on the output voltage as a clock signal CLK'; and a 1/N divider for dividing the frequency $f_o$ of the clock signal CLK' by N, where N is an arbitrary natural number, so as to supply a signal having a frequency $f_o/N$ as the clock signal CLK to the phase comparator, wherein the phase comparator and the charge-pump circuit are configured to satisfy a relationship of $K_{p2}$>$K_{p1}$ in an $I_o$-$\Delta\phi$ characteristic, where $K_{p1}$ indicates a slope $K_p$ in the case where $|\Delta\phi|$>$\Delta\phi_o$, $K_{p2}$ indicates a slope $K_p$ in the case where $|\Delta\phi|\leq\Delta\phi_o$, $K_p$ being defined by $K_p=dI_o/d\Delta\phi$, and $\Delta\phi_o$ being a constant indicating a predetermined phase error.

In one embodiment of the present invention, the phase comparator outputs an UP signal and a DN signal as the phase difference signal to the charge-pump circuit, the phase comparator includes: a section for determining a variable delay time $T_d$ in a manner that the variable delay time $T_d$ becomes larger or is maintained as a delay time $T_p$, corresponding to the phase difference $\Delta\phi$, becomes smaller; a section for generating an UP signal having a pulse width which is equal to a sum of the delay time $T_p$ corresponding to the phase difference $\Delta\phi$ and the variable delay time $T_d$, when the phase of the clock signal CLK is behind the phase of the reference clock signal REF; and a section for generating a DN signal having a pulse width which is equal to a sum of the delay time $T_p$ corresponding to the phase difference $\Delta\phi$ and the variable delay time $T_d$, when the phase of the clock signal CLK is in advance of the phase of the reference clock signal REF.

In one embodiment of the present invention, the section for generating the UP signal includes a first flip-flop for receiving the reference clock signal REF, for increasing the UP signal in response to a rising edge of the reference clock signal REF, and for reducing the UP signal in response to a reset signal R, the section for generating the DN signal includes a second flip-flop for receiving the clock signal CLK, for increasing the DN signal in response to a raising edge of the clock signal CLK, and for reducing the DN signal in response to the reset signal R, the section for determining the variable delay time $T_d$ includes a variable delay circuit operable to variably adjust a delay time of the reset signal R which is input to the first flip-flop and the second flip-flop.

In one embodiment of the present invention, the variable delay circuit includes: a variable resistance operable to delay the reset signal R; and a variable resistance control section operable to control a value of the variable resistance in accordance with the pulse width of the UP signal and the pulse signal of the DN signal.

In one embodiment of the present invention, the variable resistance includes MOS transistors, and the variable resistance control section controls the value of the variable resistance by controlling a value of the respective channel resistances of the MOS transistors.

In one embodiment of the present invention, the respective gates of the MOS transistors are controlled by a voltage $V_x$, the voltage $V_x$ is represented by the following expression (1):

$$V_X = \begin{cases} V_{X0}, & \text{for } (UP+DN) \leq V_{X0} \\ V_{X0} + (UP+DN), & \text{for } (UP+DN) > V_{X0} \end{cases} \quad (1)$$

Thus, the invention described herein makes possible the advantages of providing a phase locked loop circuit which is capable of reducing a phase noise in a locked state.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
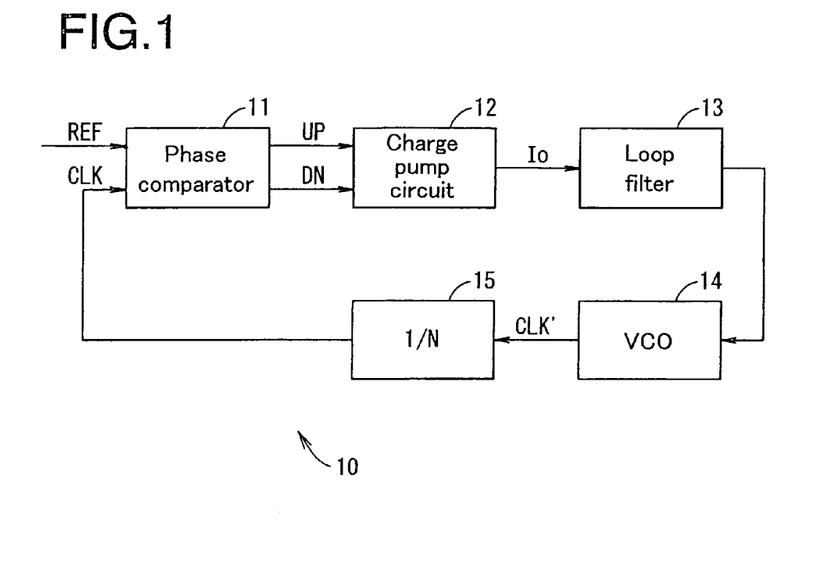
FIG. 1 is a diagram showing an exemplary configuration of a phase locked loop circuit 10 according to the present invention.

FIG. 1 shows an exemplary configuration of a phase locked loop circuit 10 according to the present invention.

The phase locked loop circuit 10 operates to match the phase of a reference clock signal REF with the phase of a clock signal CLK. When the phase of the reference clock signal REF is matched with the phase of the clock signal CLK, synchronization is established. In general, a state where synchronization is established is referred to as a locked state of the phase locked loop circuit 10.

The phase locked loop circuit 10 includes a phase comparator 11, a charge-pump circuit 12, a loop filter 13, a voltage controlled oscillator (hereinafter "VCO") 14 and a 1/N divider 15.

The phase comparator 11 receives the reference clock signal REF and the clock signal CLK and compares the phase of the reference clock signal REF with the phase of the clock signal CLK so as to output, to the charge-pump circuit 12, a phase difference signal which depends on a phase difference $\Delta\phi$ between the reference clock signal REF and the clock signal CLK.

The phase comparator 11 outputs an UP signal as the phase difference signal when the phase of the clock signal CLK is behind the phase of the reference clock signal REF, and outputs an DN signal as the phase difference signal when the phase of the clock signal CLK is in advance of the phase of the reference clock signal REF. The pulse width of the UP signal and the pulse width of the DN signal are determined depending on the phase difference $\Delta\phi$.

The charge-pump circuit 12 outputs an output current $I_o$ which depends on the phase difference signal (e.g. UP signal, DN signal) to the loop filter 13.

The loop filter 13 converts the output current $I_o$ output from the charge-pump circuit 12 into an output voltage. Such a conversion is made, for example, by integrating the output current $I_o$ and removing unnecessary higher frequency components or noise using a low-pass filter.

The VCO 14 outputs a signal having a frequency $f_o$ which depends on the output voltage output from the loop filter 13 as a clock signal CLK'.

The 1/N divider 15 divides the frequency $f_o$ of the clock signal CLK' by N (N: an arbitrary natural number) so as to supply a signal having a frequency $f_o/N$ as the clock signal CLK to the phase comparator 11.

Figure 2:
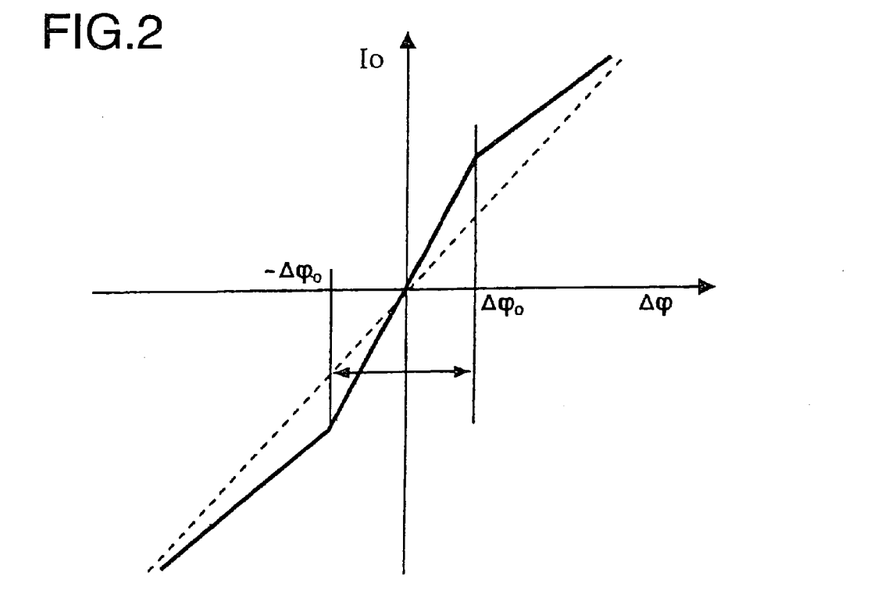
FIG. 2 is a diagram showing an example of a characteristic of the phase comparator and the charge-pump circuit (i.e. an $I_o$-$\Delta\phi$ characteristic) in the phase locked loop circuit 10 according to the present invention.

FIG. 2 shows an example of an output current $I_o$ versus the phase difference $\Delta\phi$ characteristic of the phase comparator and the charge-pump circuit (i.e. an $I_o$-$\Delta\phi$ characteristic), in the phase locked loop circuit 10 according to the present invention. In FIG. 2, the $I_o$-$\Delta\phi$ characteristic is indicated by a solid line. The vertical axis $I_o$ indicates an output current output from the charge-pump circuit 12. The horizontal axis $\Delta\phi$ indicates a phase difference detected by the phase comparator 11.

The $I_o$-$\Delta\phi$ characteristic shown in FIG. 2 is characterized in that a slope $K_p$ in the case where $|\Delta\phi| \leq \Delta\phi_o$, is greater than a slope $K_p$, in the case where $|\Delta\phi| > \Delta\phi_o$, where $K_p$ is defined by $K_p = dI_o/d\Delta\phi$, and $\Delta\phi_o$ being a constant indicating a predetermined phase error.

In other words, the $I_o$-$\Delta\phi$ characteristic shown in FIG. 2 satisfies a relationship of $K_{p2} > K_{p1}$, where $K_{p1}$ indicates a slope $K_p$ in the case where $|\Delta\phi| > \Delta\phi_o$, and $K_{p2}$ indicates a slope $K_p$ in the case where $|\Delta\phi| \leq \Delta\phi_o$.

The values of $K_{p1}$, $K_{p2}$ and a range of $\Delta\phi$ for a slope $K_{p2}$ (i.e. $-\Delta\phi_o \leq \Delta\phi \leq \Delta\phi_o$) can be designed appropriately to avoid making the locked state of the phase locked loop circuit 10 unstable, and to avoid erroneously placing the phase locked loop circuit 10 out of the locked state due to parasitic vibrations.

When the phase locked loop circuit 10 is placed in the locked state (i.e. the case where $\Delta\phi \approx 0$), the slope $K_p$ being large corresponds to the band width being broad, since the slope $K_p$ being large is equivalent to the loop gain being high. Therefore, a noise transfer coefficient in the locked state can be reduced as the slope $K_p$ becomes large in the case where $\Delta\phi \approx 0$. As a result, a phase noise in the locked state can be reduced. The effects in reducing the phase noise by the phase locked loop circuit 10 will be described later.

In the example shown in FIG. 2, $K_{p1}$ and $K_{p2}$ are constant. However, the present invention is not limited to this. For example, at least one of $K_{p1}$ and $K_{p2}$ can be a variable (e.g. a function of $\Delta\phi$). As far as a relationship of $K_{p2} > K_{p1}$ for an arbitrary $\Delta\phi$ is satisfied, any phase locked loop circuit having such an $I_o$-$\Delta\phi$ characteristic should be considered as being within in the scope of the present invention, irrespective of each of $K_{p1}$ and $K_{p2}$ being either a constant or a variable.

Figure 3:
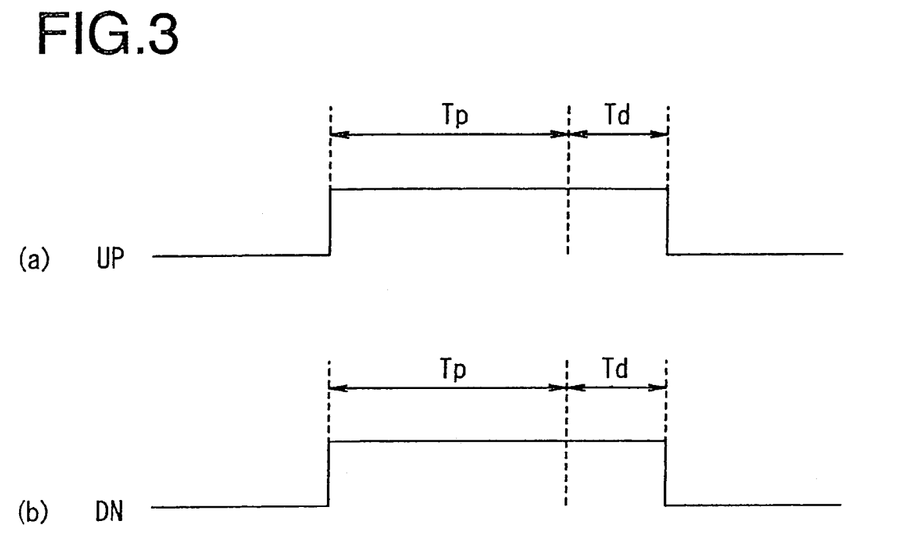
FIG. 3 is a diagram showing an example of waveforms of the UP signal and the DN signal generated by the phase comparator 11.

The $I_o$-$\Delta\phi$ characteristic shown in FIG. 2 can be implemented, for example, by the phase comparator 11 generating the UP signal and the DN signal each having the pulse width shown in FIG. 3 and by outputting the generated UP and DN signals to the charge-pump circuit 12.

FIG. 3 shows an example of waveforms of the UP signal and the DN signal generated by the phase comparator 11.

The phase comparator 11 generates an UP signal having a pulse width which is equal to a sum of a delay time $T_p$ corresponding to the phase difference $\Delta\phi$ and a variable delay time $T_d$, when the phase of the clock signal CLK is behind the phase of the reference clock signal REF (see portion (a) of FIG. 3).

The phase comparator 11 generates an DN signal having a pulse width which is equal to a sum of a delay time $T_p$ corresponding to the phase difference $\Delta\phi$ and a variable delay time $T_d$, when the phase of the clock signal CLK is in advance of the phase of the reference clock signal REF (see portion (b) of FIG. 3).

The phase comparator 11 determines a variable delay time $T_d$ in a manner that the variable delay time $T_d$ becomes larger or is maintained as the delay time $T_p$, corresponding to the phase difference $\Delta\phi$, becomes smaller. The variable delay time $T_d$ can be determined, for example, to be the inverse proportion to the delay time $T_p$ corresponding to the phase difference $\Delta\phi$.

By determining the variable delay time $T_d$ in this way, the variable delay time $T_d$ becomes latger or maintained as the phase difference Δφ approaches 0 (i.e. the phase locked loop circuit 10 approaches the locked state). This enables the slope $K_p$ in the neighborhood region of Δφ=0 to be greater than the slope $K_p$ in a region other than the neighborhood region of Δφ=0, since the output current $I_o$ increases by an amount corresponding to the variable delay time $T_d$ in the neighborhood region of Δφ=0.

The UP signal shown in FIG. 3 can be generated, for example, by increasing the UP signal in response to a rising edge of the reference clock signal REF, and by delaying the timing for reducing the UP signal by an amount corresponding to the variable delay time $T_d$ after the delay time $T_p$ corresponding to the phase difference Δφ lapses.

The DN signal shown in FIG. 3 can be generated, for example, by increasing the DN signal in response to a rising edge of the clock signal CLK, and by delaying the timing for reducing the DN signal by an amount corresponding to the variable delay time $T_d$ after the delay time $T_p$ corresponding to the phase difference Δφ lapses.

In the example shown in FIG. 3, it is described that a relationship of $K_{p2}>K_{p1}$ can be satisfied by adjusting the pulse widths of the UP and DN signals generated by the phase comparator 11. However, the present invention is not limited to this. Any phase locked loop circuit 10 including the phase comparator 11 and the charge-pump circuit 12 configured to satisfy the relationship of $K_{p2}>K_{p1}$ should be considered to be within the scope of the present invention.

Hereinafter, the configuration of the phase locked loop circuit, which is implemented using the CMOS technique, will be described as an example of the implementation of the phase locked loop circuit according to the present invention. However, the present invention is not limited to this. The phase locked loop circuit according to the present invention can be implemented using any process which is applicable to a semiconductor integrated circuit.

Figure 4:
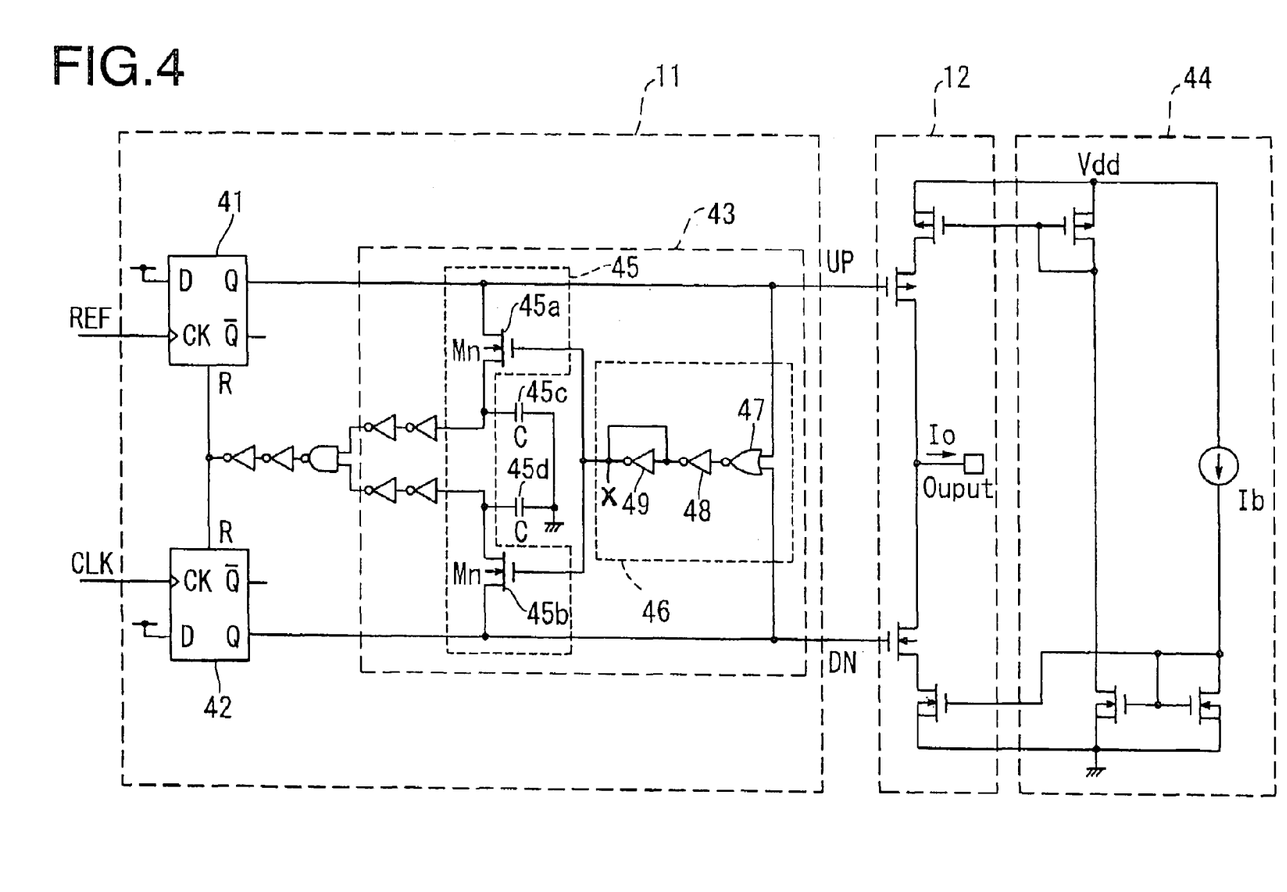
FIG. 4 is a diagram showing an example of a circuit configuration of the phase comparator 11 and the charge-pump circuit 12 shown in FIG. 1.

FIG. 4 shows an example of a circuit configuration of the phase comparator 11 and the charge-pump circuit 12 shown in FIG. 3. The circuit configuration shown in FIG. 4 realizes the phase comparator-charge-pump characteristic (i.e. $I_o$-Δφ characteristic) shown in FIG. 2.

The phase comparator 11 includes a flip-flop 41, a flip-flop 42 and a variable delay circuit 43. The flip-flops 41, 42 each can be, for example, a D-type flip-flop.

The flip-flop 41 receives the reference clock signal REF, increases the UP signal in response to a rising edge of the reference clock signal REF, and reduces the UP signal in response to a reset signal R.

The flip-flop 42 receives the clock signal CLK, increases the DN signal in response to a rising edge of the clock signal CLK, and reduces the DN signal in response to the reset signal R.

The variable delay circuit 43 is operable to variably adjust a delay time of the reset signal R (i.e. a reset path delay). The reset signal R is input to the respective reset terminals of the flip-flops 41 and 42.

The variable delay circuit 43 includes a variable resistance 45 operable to delay the reset signal R, and a variable resistance control section 46 operable to control a value of the variable resistance 45 in accordance with the pulse width of the UP signal and the pulse width of the DN signal.

The delay of the reset signal R can be implemented, for example, by a RC circuit. In the example shown in FIG. 4, the RC circuit is implemented by NMOS transistors Mn (45a, 45b) and capacitors C (45c, 45d). The variable resistance control section 46 variably controls a value of the respective channel resistances of the NMOS transistors Mn (45a, 45b) by controlling the respective gate voltages of the NMOS transistors Mn (45a, 45b). In this case, the respective channel resistances of the NMOS transistors Mn (45a, 45b) functions as the variable resistance 45.

In the example shown in FIG. 4, the variable resistance control section 46 includes a logic gate 47, a logic gate 48 and an inverter 49.

The UP signal and the DN signal are sensed using the logic gates 47 and 48. The output of the logic gate 48 is coupled to a node X. The respective gates of the NMOS transistors Mn (45a, 45b) are controlled by the voltage $V_x$ at the node X. The average voltage at the node X increases as the pulse width of the UP signal becomes larger or the pulse width of the DN signal becomes larger.

The voltage $V_x$ at the node X is represented, for example, by the following expression (2):

$$V_X = \begin{cases} V_{X0}, & \text{for } (UP+DN) \le V_{X0} \\ V_{X0} + (UP+DN), & \text{for } (UP+DN) > V_{X0} \end{cases} \quad (2)$$

In the expression (2), "UP" indicates a voltage value of the UP signal, and "DN" indicates a voltage value of the DN signal. "(UP+DN)" indicates a result, as an analog value, obtained by adding the voltage value of the UP signal (a digital value) to the voltage value of the DN signal (a digital value). $V_x$ and $V_{xo}$ each indicate an analog signal. "NOT (UP+DN)" indicates a logical operation. When it is added to $V_x$, the addition is a normal addition.

The inverter 49 is used to set a reference voltage $V_{xo}$ at the node X so that $V_x$ does not become zero. By using the inverter 49, a relationship of $V_{xo}<V_x<V_{dd}$ is satisfied, where $V_{xo}$ indicating a logic trip voltage of the inverter 49, $V_{dd}$ indicating a power supply voltage supplied from a bias circuit 44.

Figure 5:
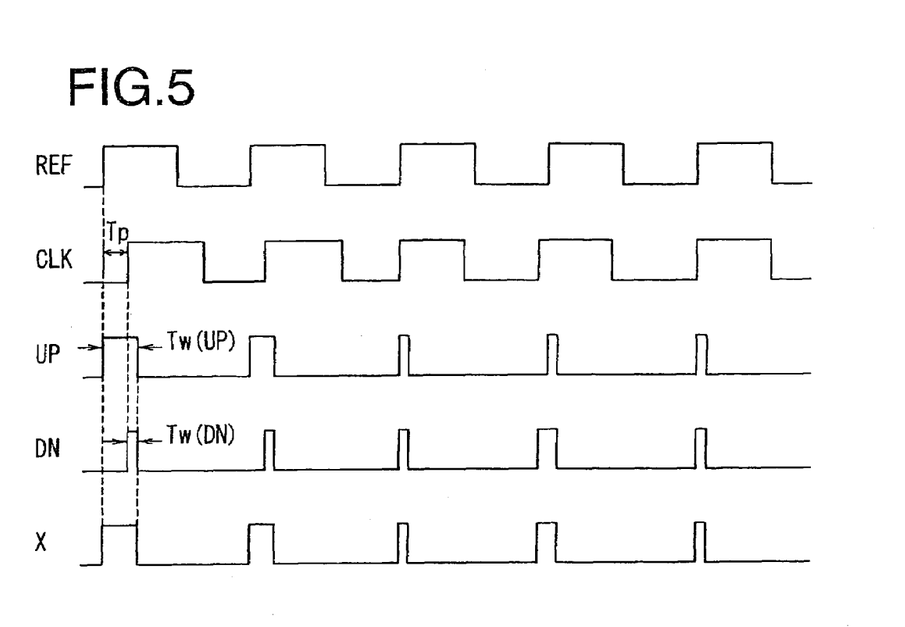
FIG. 5 is a diagram showing an example of waveforms of the main signals in the phase locked loop circuit 10.

FIG. 5 shows an example of waveforms of the main signals in the phase locked loop circuit 10. In Figure signals in the phase locked loop circuit 10. In FIG. 5, "REF" indicates a wave form of the reference clock signal, "CLK" indicates a waveform of the clock signal, "UP" indicates a waveform of the UP signal, "DN" indicates a waveform of the DN signal, and "X" indicates a waveform of the voltage $V_x$ at the node X.

FIG. 5 shows a case where the phase of the clock signal CLK is behind the phase of the reference clock signal REF by the phase difference Δφ corresponding to the delay time $T_p$. In this case, the phase comparator 11 generates the UP signal such that the UP signal is changed from a low level to a high level in response to a rising edge of the reference clock signal REF and the UP signal is changed from a high level to a low level in response to the reset signal R, and generates the DN signal such that the DN signal is changed from a low level to a high level in response to a rising edge of the clock signal CLK and the UP signal is changed from a high level to a low level in response to the reset signal R.

In the example shown in FIG. 5, the pulse width $T_w(UP)$ of the UP signal is determined as a sum of the delay time $T_p$ and the pulse width $T_w(DN)$ of the DN signal (i.e. $T_w(UP)= T_p+T_w(DN)$).

When the phase of the reference clock signal REF is matched with the phase of the clock signal CLK, the phase locked loop circuit 10 is placed into a locked state. In the locked state, the UP signal is identical to the DN signal, and each of the pulse width $T_w(UP)$ of the UP signal and the pulse width $T_w(DN)$ of the DN signal is equal to a minimum pulse width $\delta_w$ (i.e. $T_w(UP)=T_w(DN)=\delta_w$).

In the example shown in FIG. 5, the pulse width $T_w(DN)$ of the DN signal is determined as a sum of the minimum pulse width $\delta_w$ and a variable pulse width $\delta_{dn}$ (i.e. $T_w(DN) = \delta_w + \delta_{dn}$). $\delta_{dn}$ varies depending on the pulse width $T_w(UP)$ of the UP signal.

The variable pulse width $\delta_{dn}$ is represented by the following expressions (3):

$$\delta_{dn} = k \times C \times R_{MOS}, \quad (3)$$

$$R_{MOS} \cong \frac{1}{\beta_{MOS} \times (V_X - V_{th})}$$

where k: a proportional constant,

C: a capacitance of each of capacitors 45c and 45d $R_{MOS}$: a resistance value of the variable resistance 45

$\hat{a}_{MOS}$: a conductance parameter (constant) of each of the MOS transistors 45a and 45b $V_x$: a voltage at the node X $V_{th}$: a threshold voltage of each of the MOS transistors 45a and 45b.

When the phase of the clock signal CLK is in advance of the phase of the reference clock signal REF by the phase difference $\Delta\phi$ corresponding to the delay time $T_p$, the phase comparator 11 generates the UP signal and the DN signal in the same way as the case where the phase of the clock signal CLK is behind the phase of the reference clock signal REF by the phase difference $\Delta\phi$ corresponding to the delay time $T_p$. Specifically, the phase comparator 11 generates the UP signal such that the UP signal is changed from a low level to a high level in response to a rising edge of the reference clock signal REF, and the UP signal is changed from a high level to a low level in response to the reset signal R. The DN signal is generated such that the DN signal is changed from a low level to a high level in response to a rising edge of the clock signal CLK and the UP signal is changed from a high level to a low level in response to the reset signal R.

In this case, the pulse width $T_w(DN)$ of the DN signal is determined as a sum of the delay time $T_p$ and the pulse width $T_w(UP)$ of the UP signal (i.e. $T_w(DN) = T_p + T_w(UP)$). The pulse width $T_w(UP)$ of the UP signal is determined as a sum of the minimum pulse width $\delta_w$ and a variable pulse width $\delta_{dn}$ (i.e. $T_w(UP) = \delta_w + \delta_{dn}$).

Thus, in the embodiment of the present invention, a large slope $K_p$, in the case where $\Delta\phi \approx 0$, can be realized by adjusting the timing of the phase difference signal (the UP and DN signals) output from the phase comparator 11. According to this approach, it is not necessary to increase the charge-pump current in the locked state. Therefore, the power consumption is not increased. Accordingly, the phase locked loop circuit 10 can be preferably used in a system which requires low power consumption (e.g. a system which operates by a portable battery).

Figure 6:
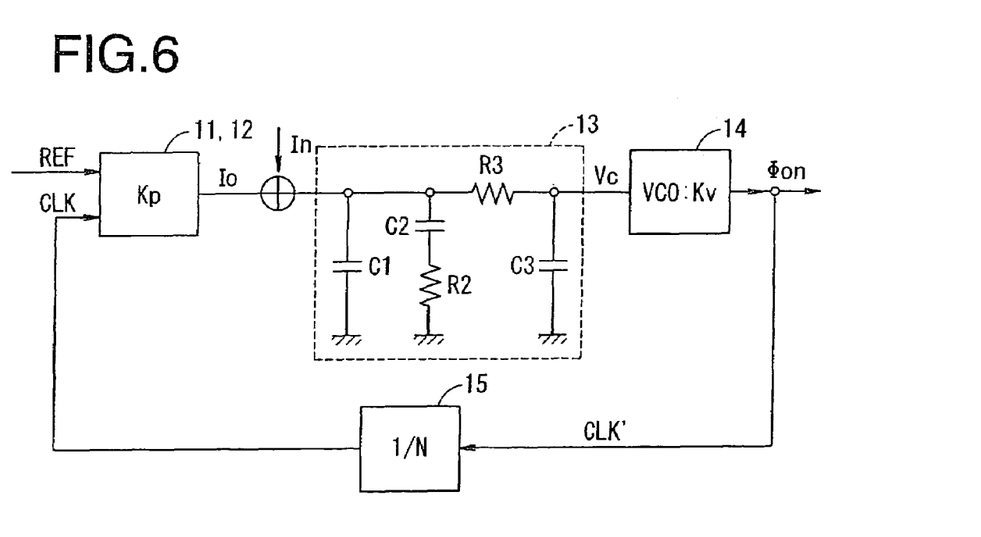
FIG. 6 is a diagram showing a model of the phase locked loop circuit 10.

FIG. 6 shows a model of the phase locked loop circuit 10. It will be described below, using this model, how phase noise can be reduced.

In the model shown in FIG. 6, it is assumed that all noise in the phase comparator 11 and charge-pump circuit 12 are represented by a current noise generator $I_n$ at the output of the charge-pump circuit 12. The gain of the combination of the phase comparator 11 with the charge-pump circuit 12 is defined as $K_p$ (i.e. $K_p = dI_o/d\Delta\phi$).

The transfer function from the current noise generator $I_n$ to the output of the VCO 14 is represented by the following expression (4):

$$\frac{\Phi_{on}}{I_n} = \frac{F(s) \cdot \frac{K_v}{s}}{1 + \frac{K_p F(s) K_v}{N \cdot s}} \quad (4)$$

where $\Phi_{on}$: noise on the output of the VCO 14, $I_n$: input noise $F(s)/s$: a transfer function of the loop filter 13

$K_v$: the gain of the VCO 14

$K_p = dI_o/d\Delta\phi$

N: a factor of divider

When $\omega \to 0$ ($s = j\omega$) in the expression (4), the expression (4) is modified into the following expression (5):

$$\frac{\Phi_{on}}{I_n} \cong \frac{N}{K_p} \quad (5)$$

It can be understood from the expression (5) that a relatively greater slope $K_p$ in the case where $\Delta\phi \approx 0$ is effective in reducing the phase noise in the locked state.

Figure 7:
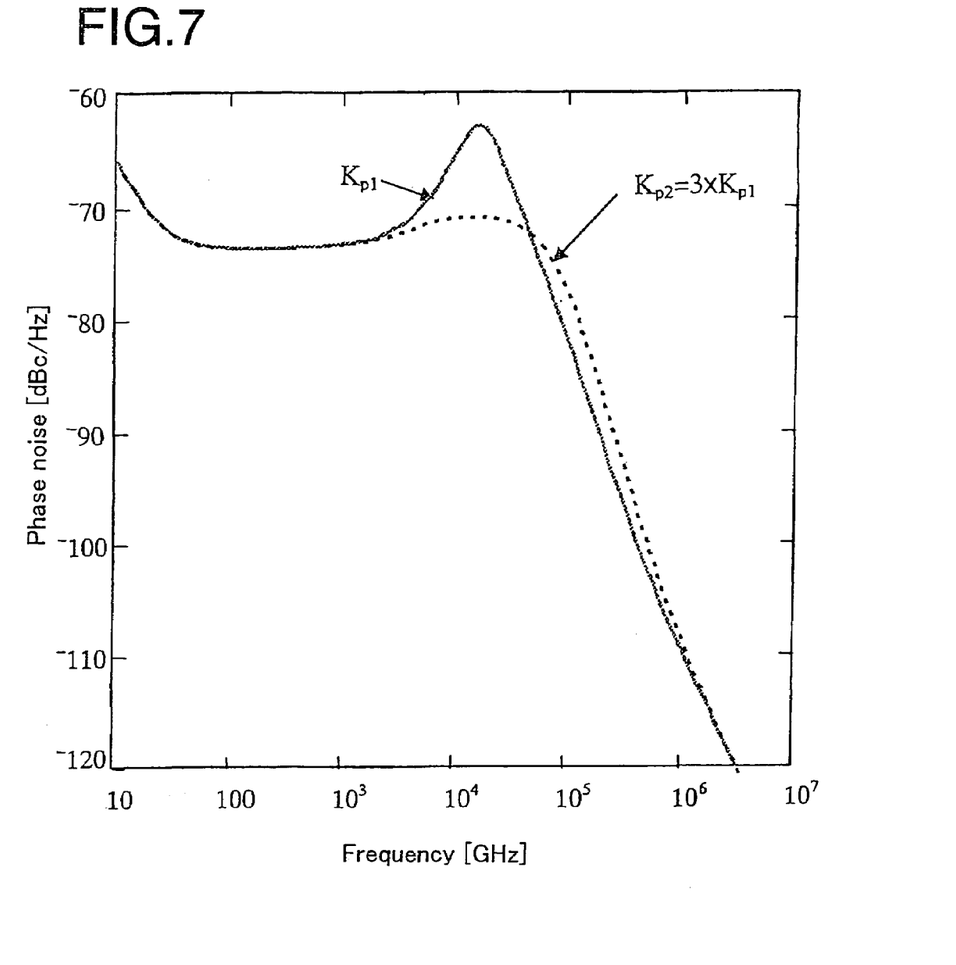
FIG. 7 is a diagram showing a reducing effect of the phase noise by the phase locked loop circuit 10.

FIG. 7 shows a reducing effect of the phase noise by the phase locked loop circuit 10. FIG. 7 shows a case where $K_{p2} = 3 \times K_{p1}$. It can be understood from FIG. 7 that the phase noise at the edge of the loop band can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A phase locked loop circuit comprising:
   a phase comparator for receiving a reference clock signal REF and a clock signal CLK and for comparing a phase of the reference clock signal REF with a phase of the clock signal CLK so as to output a phase difference signal which depends on a phase difference $\Delta\phi$ between the reference clock signal REF and the clock signal CLK;
   a charge-pump circuit for producing an output current $I_o$ which depends on the phase difference signal;
   a loop filter for converting the output current $I_o$ into an output voltage;
   a voltage controlled oscillator for generating a signal having a frequency $f_o$ which depends on the output voltage as a clock signal CLK'; and
   a 1/N divider for dividing the frequency $f_o$ of the clock signal CLK' by N, where N is an arbitrary natural number, so as to supply a signal having a frequency $f_o/N$ as the clock signal CLK to the phase comparator,
   wherein the phase comparator and the charge-pump circuit are configured to satisfy a relationship of $K_{p2} > K_{p1}$ in an $I_o - \Delta\phi$ characteristic, where $K_{p1}$ indicates a slope $K_p$ in the case where $|\Delta\phi| > \Delta\phi_o$, $K_{p2}$ indicates a slope $K_p$ in the case where $|\Delta\phi| \leq \Delta\phi_o$, $K_p$ being defined by $K_p = dI_o/d\Delta\phi$, and $\Delta\phi_o$ being a constant indicating a predetermined phase error.

2. A phase locked loop circuit according to claim 1, wherein:

the phase comparator outputs an UP signal and a DN signal as the phase difference signal to the charge-pump circuit, the phase comparator includes:

a section for determining a variable delay time $T_d$ in a manner that the variable delay time $T_d$ becomes larger or is maintained as a delay time $T_p$, corresponding to the phase difference $\Delta\phi$, becomes smaller;

a section for generating an UP signal having a pulse width which is equal to a sum of the delay time $T_p$ corresponding to the phase difference $\Delta\phi$ and the variable delay time $T_d$, when the phase of the clock signal CLK is behind the phase of the reference clock signal REF; and a section for generating a DN signal having a pulse width which is equal to a sum of the delay time $T_p$ corresponding to the phase difference $\Delta\phi$ and the variable delay time $T_d$, when the phase of the clock signal CLK is in advance of the phase of the reference clock signal REF.

3. A phase locked loop circuit according to claim 2, wherein:

the section for generating the UP signal includes a first flip-flop for receiving the reference clock signal REF, for increasing the UP signal in response to a rising edge of the reference clock signal REF, and for reducing the UP signal in response to a reset signal R, the section for generating the DN signal includes a second flip-flop for receiving the clock signal CLK, for increasing the DN signal in response to a raising edge of the clock signal CLK, and for reducing the DN signal in response to the reset signal R, the section for determining the variable delay time $T_d$ includes a variable delay circuit operable to variably adjust a delay time of the reset signal R which is input to the first flip-flop and the second flip-flop.

4. A phase locked loop circuit according to claim 3, wherein:

the variable delay circuit includes:

a variable resistance operable to delay the reset signal R; and a variable resistance control section operable to control a value of the variable resistance in accordance with the pulse width of the UP signal and the pulse signal of the DN signal.

5. A phase locked loop circuit according to claim 4, wherein:

the variable resistance includes MOS transistors, and the variable resistance control section controls the value of the variable resistance by controlling a value of the respective channel resistances of the MOS transistors.

6. A phase locked loop circuit according to claim 5, wherein the respective gates of the MOS transistors are controlled by a voltage $V_x$, the voltage $V_x$ is represented by the following expression (1):

$$V_X = \begin{cases} V_{X0}, & \text{for } (UP+DN) \leq V_{X0} \\ V_{X0} + (UP+DN), & \text{for } (UP+DN) > V_{X0} \end{cases} \quad (1)$$

* * * * *